United States Patent [19]
Higuchi

[11] Patent Number: 5,297,103
[45] Date of Patent: Mar. 22, 1994

[54] ELECTRICALLY ERASABLE AND PROGRAMMABLE SEMICONDUCTOR MEMORY DEVICE

[75] Inventor: Mitsuo Higuchi, Kawasaki, Japan

[73] Assignee: Fujitsu Limited, Kawasaki, Japan

[21] Appl. No.: 4,864

[22] Filed: Jan. 19, 1993

[30] Foreign Application Priority Data

Jan. 20, 1992 [JP] Japan ................... 4-007420

[51] Int. Cl.[5] ............................... G11C 7/00
[52] U.S. Cl. ................... 365/230.03; 365/185; 365/900; 365/189.01
[58] Field of Search ............ 365/230.01, 230.02, 365/230.03, 230.04, 231, 189.01, 189.02, 189.12, 185, 900; 395/400, 425; 364/246, 267.4

[56] References Cited

U.S. PATENT DOCUMENTS 4,718,038 1/1988 Yoshida ................. 364/900
5,210,716 5/1993 Takada ................. 365/185

FOREIGN PATENT DOCUMENTS 63-200398 8/1988 Japan .
1-107400 4/1989 Japan .
3-228298 10/1991 Japan .
3-237696 10/1991 Japan .
4-64998 2/1992 Japan .

Primary Examiner—Eugene R. LaRoche
Assistant Examiner—Vu A. Le
Attorney, Agent, or Firm—Nikaido, Marmelstein, Murray & Oram

[57] ABSTRACT

An electrically erasable and programmable memory device includes a memory cell array including a plurality of blocks, each including electrically erasable and programmable memory cells. A data input/output unit transfers data between the memory cell array and an external device. An address conversion unit converts an external address signal into a decoded signal applied to the memory cell array so that the correspondence between the external address and the plurality of blocks is changed so as to equally access the plurality of blocks for programming. The number of the plurality of blocks is greater than the number of blocks accessible by the external address signal.

13 Claims, 15 Drawing Sheets

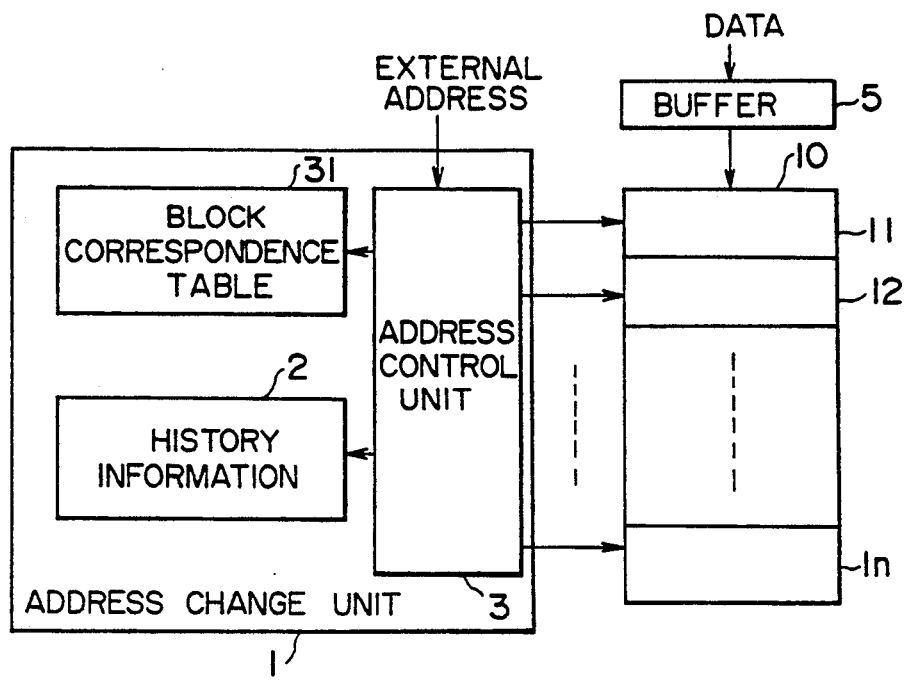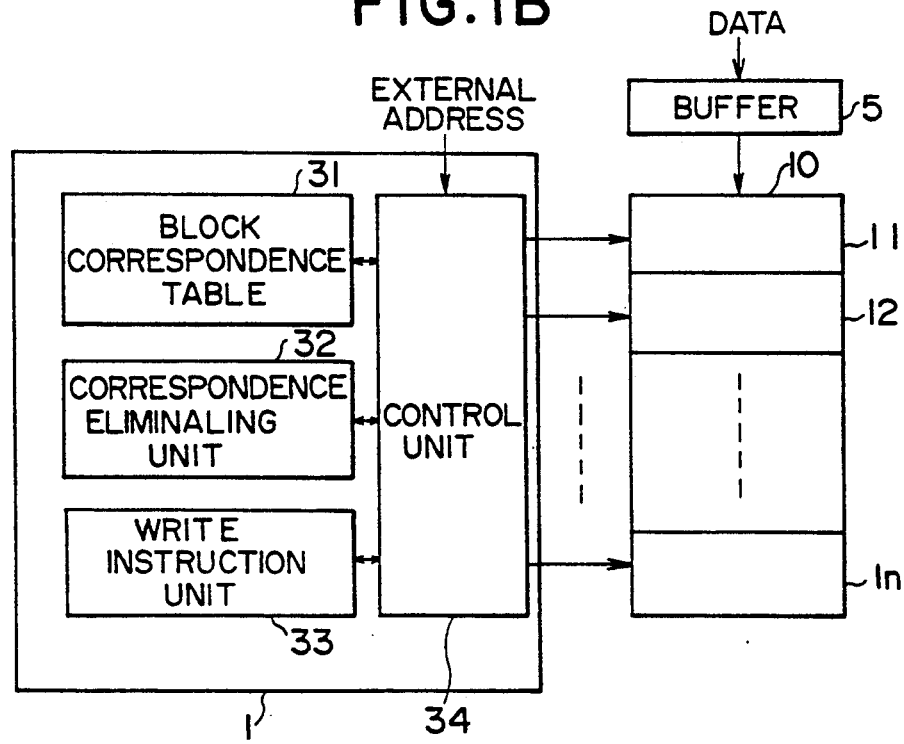

FIG. 5

| MODE | *R | *W | *P | *CGC | *VSC1 | *VSC2 | *NSC1 | *NSC2 | *CGA1 | *CGA2 | *VSA1 | *VSA2 | *NSA |
|---|---|---|---|---|---|---|---|---|---|---|---|---|---|
| 1 | 0 | 1 | 1 | 1 | 0 | 0 | 1 | 0 | 0 | 0 | 0 | 0 | 0 |
| 2 | 1 | 1 | 1 | 1 | 1 | 0 | 0 | 0 | 0 | 0 | 1 | 0 | 1 |
| 3 | 0 | 1 | 1 | 1 | 0 | 0 | 1 | 0 | 0 | 0 | 0 | 0 | 0 |
| 4 | 1 | 0 | 1 | 1 | 0 | 0 | 0 | 0 | 1 | 0 | 0 | 0 | 1 |
| 5 | 0 | 1 | 1 | 1 | 0 | 0 | 0 | 1 | 0 | 0 | 0 | 0 | 0 |
| 6 | 1 | 1 | 1 | 1 | 0 | 1 | 0 | 0 | 0 | 0 | 0 | 1 | 1 |
| 7 (*) | 0 | 1 | 1 | 0 | 0 | 0 | 0 | 0 | 0 | 0 | 0 | 0 | 0 |
|  | 0 | 1 | 1 | 1 | 0 | 0 | 0 | 1 | 0 | 0 | 0 | 0 | 0 |
| 8-1 | 1 | 0 | 1 | 1 | 0 | 0 | 0 | 0 | 0 | 1 | 0 | 0 | 1 |
| 8-2 | 1 | 0 | 0 | 0 | 0 | 0 | 0 | 0 | 0 | 0 | 0 | 0 | 1 |
| 9 | 1 | 1 | 1 | 1 | 0 | 0 | 0 | 0 | 0 | 0 | 0 | 0 | 1 |
| 10 | 1 | 1 | 1 | 1 | 0 | 0 | 0 | 0 | 0 | 0 | 0 | 0 | 1 |

FIG. 6

| MODE | R | W | P | CGC S | CGC NS | -VSC S | -VSC NS | /NSC S | /NSC NS | CGA S | CGA NS | VSA S | VSA NS | /NSA |
|---|---|---|---|---|---|---|---|---|---|---|---|---|---|---|
| 1 | $V_{cc}$ | $V_{ss}$ | $V_{ss}$ | $V_{ss}$ | $V_{ss}$ | $V_{ss}$ | $V_{ss}$ | $V_{cc}$ | $V_{ss}$ | $V_{ss}$ | $V_{ss}$ | $V_{ss}$ | $V_{ss}$ | $V_{cc}$ |
| 2 | $V_{ss}$ | $V_{ss}$ | $V_{ss}$ | $V_{ss}$ | $V_{ss}$ | $V_{pp}$ | $V_{ss}$ | $V_{ss}$ | $V_{ss}$ | $V_{ss}$ | $V_{ss}$ | $V_{pp}$ | $V_{ss}$ | $V_{ss}$ |
| 3 | $V_{cc}$ | $V_{ss}$ | $V_{ss}$ | $V_{pp}$ | $V_{pp}$ | $V_{cc}$ | $V_{cc}$ | $V_{cc}$ | $V_{ss}$ | $V_{ss}$ | $V_{ss}$ | $V_{ss}$ | $V_{ss}$ | $V_{cc}$ |
| 4 | $V_{ss}$ | $V_{pp}$ | $V_{ss}$ | $V_{ss}$ | $V_{ss}$ | $V_{ss}$ | $V_{ss}$ | $V_{ss}$ | $V_{ss}$ | $V_{pp}$ | $V_{ss}$ | $V_{ss}$ | $V_{ss}$ | $V_{ss}$ |
| 5 | $V_{cc}$ | $V_{ss}$ | $V_{cc}$ | $V_{ss}$ | $V_{ss}$ | $V_{pp}$ | $V_{ss}$ | $V_{cc}$ | $V_{ss}$ | $V_{ss}$ | $V_{ss}$ | $V_{ss}$ | $V_{ss}$ | $V_{cc}$ |
| 6 | $V_{cc}$ | $V_{cc}$ | $V_{ss}$ | $V_{cc}$ | $V_{cc}$ | $V_{ss}$ | $V_{ss}$ | $V_{ss}$ | $V_{ss}$ | $V_{ss}$ | $V_{ss}$ | $V_{pp}$ | $V_{ss}$ | $V_{ss}$ |
| 7 | $V_{cc}$ | $V_{ss}$ | $V_{ss}$ | $V_{pp}$ | $V_{ss}$ | $V_{ss}$ | $V_{ss}$ | $V_{cc}$ | $V_{ss}$ | $V_{ss}$ | $V_{ss}$ | $V_{ss}$ | $V_{ss}$ | $V_{cc}$ |
| 8-1 | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{pp}$ | $V_{ss}$ | $V_{ss}$ | $V_{ss}$ | $V_{ss}$ |
| 8-2 | $V_{ss}$ | $V_{pp}$ | $V_{pp}$ | $V_{pp}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ |
| 9 | $V_{ss}$ | $V_{ss}$ | $V_{pp}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ |
| 10 | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ | $V_{ss}$ |

| | BLOCKS | | | | | 20 (LEFT:TC, RIGHT:TA) | | | | | 33A | 32A | 31 | RADR | INPUT DATA |
|---|---|---|---|---|---|---|---|---|---|---|---|---|---|---|---|
| | 1 | 2 | 3 | 4 | 5 | 1 | 2 | 3 | 4 | 5 | | | | | |
| (0) | ? | (00) | (01) | (10) | (11) | N,? | S,00 | S,01 | S,10 | S,11 | — | 2 | 1=X,2=00,3=01,4=10,5=11 | 10 | (10) |
| (1) | B | (00) | (01) | (10) | (11) | N,? | S,00 | S,01 | S,10 | S,11 | — | 2 | 1=X,2=00,3=01,4=10,5=11 | 10 | (10) |
| (2) | B | (00) | (01) | (10) | (11) | S,B | S,00 | S,01 | S,10 | S,11 | — | 2 | 1=X,2=00,3=01,4=10,5=11 | 10 | (10) |
| (3) | (10) | (00) | (01) | (10) | (11) | S,B | S,00 | S,01 | S,10 | S,11 | — | 2 | 1=X,2=00,3=01,4=10,5=11 | 10 | (10) |
| (4) | (10) | (00) | (01) | B | (11) | S,10 | S,00 | S,01 | S,10 | S,11 | — | 2 | 1=X,2=00,3=01,4=10,5=11 | 10 | (10) |
| (5) | (10) | (00) | (01) | B | (11) | S,10 | S,00 | S,01 | S,10 | S,11 | — | 2 | 1=X,2=00,3=01,4=10,5=11 | 10 | (10) |
| (6) | (10) | (00) | (01) | B | (11) | S,10 | S,00 | S,01 | S,B | S,11 | — | 2 | 1=X,2=00,3=01,4=10,5=11 | 10 | (10) |

NOTE
B: BLANK
S: SELECTABLE STATE (ERASE)
N: NON-SELECTABLE STATE (WRITE)
X: DON'T CARE

| | BLOCKS | | | | | 20 (LEFT:TC, RIGHT:TA) | | | | | 33A | 32A | 31 | RADR | INPUT DATA |
|---|---|---|---|---|---|---|---|---|---|---|---|---|---|---|---|
| | 1 | 2 | 3 | 4 | 5 | 1 | 2 | 3 | 4 | 5 | | | | | |
| (5) | (10) | (00) | (01) | B | (11) | S,10 | S,00 | S,01 | S,10 | S,11 | 1 | 2 | 1=X,2=00,3=01,4=10,5=11 | 10 | (10) |
| (6) | (10) | (00) | (01) | B | (11) | S,10 | S,00 | S,01 | S,B | S,11 | 1 | 2 | 1=X,2=00,3=01,4=10,5=11 | 10 | (10) |
| (7) | (10) | (00) | (01) | (00) | (11) | S,10 | S,00 | S,01 | S,B | S,11 | 1 | 2 | 1=X,2=00,3=01,4=10,5=11 | 10 | (10) |
| (8) | (10) | (00) | (01) | (00) | (11) | S,10 | S,00 | S,01 | S,00 | S,11 | 1 | 2 | 1=X,2=00,3=01,4=10,5=11 | 10 | (10) |
| (9) | (10) | (00) | (01) | (00) | (11) | S,10 | N,00 | S,01 | S,00 | S,11 | 1 | 2 | 1=X,2=00,3=01,4=10,5=11 | 10 | (10) |
| (10) | (10) | (00) | (01) | (00) | (11) | S,10 | N,00 | S,01 | S,00 | S,11 | 2 | 3 | 1=10,2=X,3=01,4=00,5=11 | 10 | (10) |
| (11) | (10) | (00) | (01) | (00) | (11) | S,10 | N,00 | S,01 | S,00 | S,11 | 2 | 3 | 1=10,2=X,3=01,4=00,5=11 | 10 | (10) |

NOTE
B: BLANK
S: SELECTABLE STATE (ERASE)
N: NON-SELECTABLE STATE (WRITE)
X: DON'T CARE

FIG.11A

| | BLOCKS | | | | | | | 20 (LEFT:TC, RIGHT:TA) | | | | | | 33A | 32A | 31 | RADR | INPUT DATA |
|---|---|---|---|---|---|---|---|---|---|---|---|---|---|---|---|---|---|---|
| | 1 | 2 | 3 | 4 | 5 | 6 | | 1 | 2 | 3 | 4 | 5 | 6 | | | | | |
| [0] | (00) | (01) | (10) | (11) | ? | ? | | S,00 | S,01 | S,10 | S,11 | N,? | N,? | 5&6 | 1&2 | 1=00,2=01,3=10,4=11,5=X,6=X | 01&10 | (01&10) |
| [1] (1) | (00) | (01) | (10) | (11) | B | B | | S,00 | S,01 | S,10 | S,11 | N,? | N,? | 5&6 | 1&2 | 1=00,2=01,3=10,4=11,5=X,6=X | 0&10 | (01&10) |
| [1] (2) | (00) | (01) | (10) | (11) | B | B | | S,00 | S,01 | S,10 | S,11 | S,B | S,D | 5&6 | 1&2 | 1=00,2=01,3=10,4=11,5=X,6=X | 01&10 | (01&10) |
| [1] (3) | (00) | (01) | (10) | (11) | (01) | (10) | | S,00 | S,01 | S,10 | S,11 | S,B | S,B | 5&6 | 1&2 | 1=00,2=01,3=10,4=11,5=X,6=X | 01&10 | |
| [2] (4) | (00) | (01) | (10) | (11) | (01) | (10) | | S,00 | S,01 | S,10 | S,11 | S,01 | S,10 | 5&6 | 1&2 | 1=00,2=01,3=10,4=11,5=X,6=X | 01&10 | (01&10) |
| [2] (5) | (00) | B | B | (11) | (01) | (10) | | S,00 | S,B | S,B | S,11 | S,01 | S,10 | 5&6 | 1&2 | 1=00,2=01,3=10,4=11,5=X,6=X | 01&10 | (01&10) |
| [3] (6) | (00) | B | B | (11) | (01) | (10) | | S,00 | S,B | S,B | S,11 | S,01 | S,10 | 5&6 | 1&2 | 1=00,2=01,3=10,4=11,5=X,6=X | 01&10 | (01&10) |

NOTE B: BLANK
S: SELECTABLE STATE (ERASE)
N: NON-SELECTABLE STATE (WRITE)
X: DON'T CARE

| | BLOCKS | | | | | | 20 (LEFT:TC, RIGHT:TA) | | | | | | 33A | 32A | 31 | RADR | INPUT DATA |
|---|---|---|---|---|---|---|---|---|---|---|---|---|---|---|---|---|---|
| | 1 | 2 | 3 | 4 | 5 | 6 | 1 | 2 | 3 | 4 | 5 | 6 | | | | | |
| [3] (6) | (00) | B | B | (11) | (01) | (11) | S,00 | S,B | S,B | S,B | S,01 | S,10 | 5&6 | 1&2 | 1=00,2=01,3=10,4=11,5=X,6=X | 01&10 | (01&10) |
| [3] (7-1) | (00) | (00) | B | (11) | (01) | (11) | S,00 | S,00 | S,B | S,B | S,01 | S,10 | 5&6 | 1&2 | 1=00,2=01,3=10,4=11,5=X,6=X | 01&10 | (01&10) |
| [3] (7-2) | (00) | (00) | (00) | (11) | (01) | (11) | S,00 | S,00 | S,00 | S,B | S,01 | S,10 | 5&6 | 1&2 | 1=00,2=01,3=10,4=11,5=X,6=X | 01&10 | (01&10) |
| [4] (5-1) | (00) | (00) | (00) | (11) | (01) | (11) | S,00 | S,00 | S,00 | S,11 | S,01 | S,10 | 5&6 | 1&2 | 1=00,2=01,3=10,4=11,5=X,6=X | 01&10 | (01&10) |
| [4] (5-2) | (00) | (00) | (00) | (11) | (01) | (11) | N,00 | N,00 | S,00 | S,11 | S,01 | S,10 | 5&6 | 1&2 | 1=00,2=01,3=10,4=11,5=X,6=X | 01&10 | (01&10) |
| [4] (9) | (00) | (00) | (00) | (11) | (11) | (11) | N,00 | N,00 | S,00 | S,11 | S,01 | S,10 | 5&6 | 1&2 | 1=X,2=X,3=00,4=11,5=01,6=10 | 01&10 | (01&10) |
| [4] (10) | (00) | (00) | (00) | (11) | (11) | (11) | N,00 | N,00 | S,00 | S,11 | S,01 | S,10 | 1&2 | 3&4 | 1=X,2=X,3=00,4=11,5=01,6=10 | 01&10 | (01&10) |

NOTE
B: BLANK
S: SELECTABLE STATE (ERASE)
N: NON-SELECTABLE STATE (WRITE)
X: DON'T CARE

FIG.11B

ELECTRICALLY ERASABLE AND PROGRAMMABLE SEMICONDUCTOR MEMORY DEVICE

BACKGROUND OF THE INVENTION

1. Field of the Invention

The present invention generally relates to electrically erasable and programmable semiconductor integrated memory devices, and more particularly to a block erasing type of electrically erasable and programmable semiconductor memory device.

2. Description of the Prior Art

A flash memory is an electrically erasable and programmable read only memory (EEPROM). A large quantity of data can be erased from the flash memory at the same time. In the early stage of the development of flash memories, pieces of data stored in all memory cells (bits) were simultaneously erased before programming even when it was required to change only some pieces of data. If only some pieces of data needed to be changed, it was necessary to save all of the other pieces of data in another memory. However, this procedure needs a longer time for programming as the integration density increases. Further, in practice, a large storage capacity is needed to save data which is not changed.

With the above in mind, a block erasing type of flash memory has been proposed in which the memory cell array is divided into blocks and only one or more necessary blocks are changed.

However, the conventional block erasing type of flash memories has the following disadvantages. The relationship between an external address applied to the flash memory and the memory cell is fixed. This means that one memory cell can be specified by one address value and cannot be accessed by any other address values. Hence, if an address specifying the same block is applied to the flash memory n times, the contents of the memory cells included in the specified block are changed n times. In this regard, there is a possibility that a particular block or a set of blocks is more frequently subjected to programming than other blocks. For example, some blocks have been programmed a large number of times, while other blocks have been programmed a small number of times. This may be also caused by the behavior of a program. Generally, flash memories can be repeatedly programmed in the range of 10,000 to 100,000 times. When the lifetime of a block has expired, the lifetime of the entire flash memory has expired even if the lifetimes of the other blocks have not expired.

With the above in mind, improved flash memories have been proposed in which the number of times that programming has been performed is monitored for each block. When programming has been carried out for a block a number of times greater than a threshold value, the correspondence between the external address and the memory cells is changed (see Japanese Laid-Open Patent Publication Nos. 63-200398 and 4-64998). Another improved flash memory has been proposed in which the beginning write position for programming is cyclically changed and tag information is used to specify the beginning of a series of pieces of data written into the flash memory (see Japanese Laid-Open Patent Publication No. 1-107400).

However, in practice, complex procedures are needed to achieve the above-mentioned proposed structures. Hence, the load on a system for controlling flash memories increases.

SUMMARY OF THE INVENTION

It is a general object of the present invention to provide an electrically programmable and erasable semiconductor memory device in which the above disadvantages are eliminated.

A more specific object of the present invention is to provide an electrically programmable and erasable semiconductor memory device in which the blocks are equally subjected to programming without increase in the load on a system for controlling the memory device even when a program generating a request for access to a particular block or blocks is used.

The above objects of the present invention are achieved by an electrically erasable and programmable memory device comprising: a memory cell array comprising a plurality of blocks, each block comprising electrically erasable and programmable memory cells; data input/output means, coupled to the memory cell array, for transferring data between the memory cell array and an external device; and address conversion means, coupled to the memory cell array, for converting an external address signal into a decoded signal applied to the memory cell array so that a correspondence between the external address and the plurality of blocks is changed so as to equally access the plurality of blocks for programming, the number of the plurality of blocks being greater than the number of blocks accessible by the external address signal.

BRIEF DESCRIPTION OF THE DRAWINGS

Other objects, features and advantages of the present invention will become more apparent from the following detailed description when read in conjunction with the accompanying drawings, in which:

FIG. 1A is a block diagram of an overview of a first embodiment of the present invention;

FIG. 1B is a block diagram of an overview of a variation of the first embodiment of the present invention;

FIG. 5 is a diagram showing the logic values of input signals applied to the control circuit shown in FIG. 4;

FIG. 6 is a diagram showing the logic values of output signals applied to the control circuit shown in FIG. 4;

FIGS. 9A and 9B are diagrams showing the operation of the first embodiment of the present invention;

FIGS. 11A and 11B are diagrams showing the operation of the second embodiment of the present invention.

DESCRIPTION OF THE PREFERRED EMBODIMENTS

Figure 2:
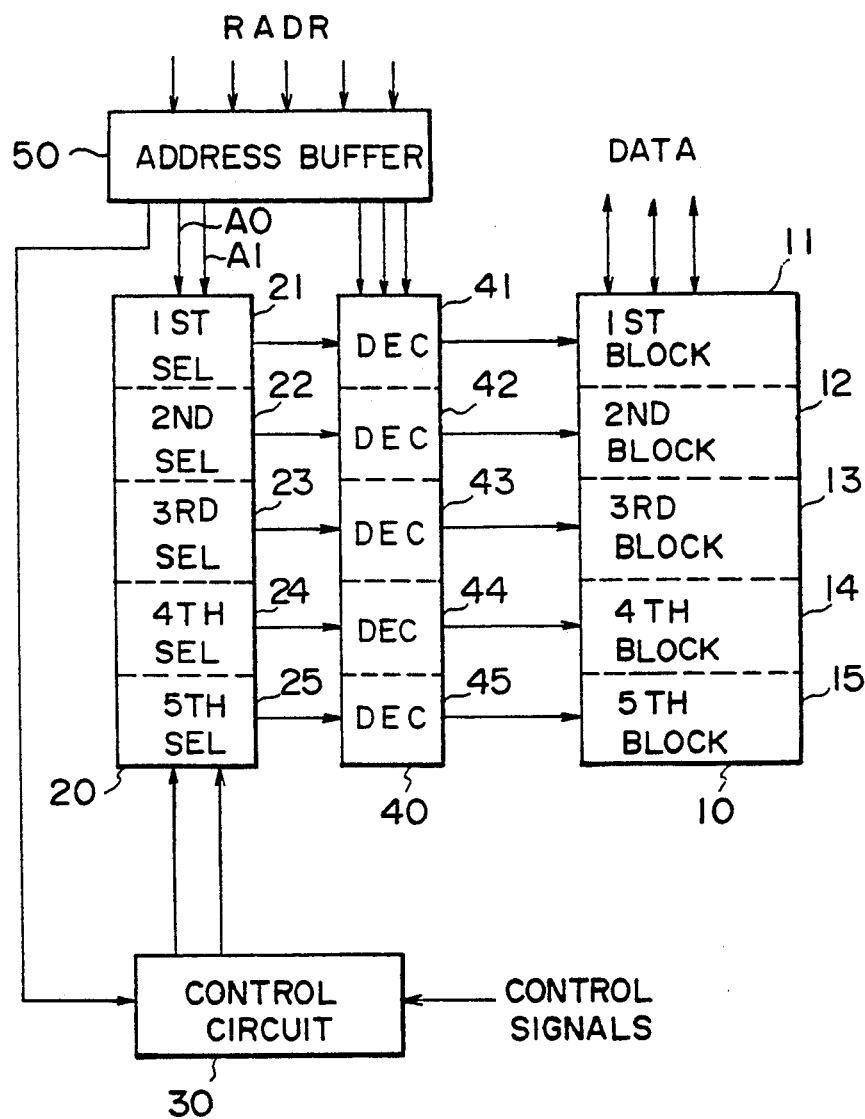
FIG. 2 is a block diagram of a first embodiment of the present invention.

Referring to FIG. 1A, an electrically erasable and programmable semiconductor memory device according to the first embodiment of the present invention comprises an address change unit 1, a buffer unit 5, and a memory cell array 10. The address change unit 1 comprises a write history information holding unit 2, an address control unit 3, and a block correspondence table 31. The memory cell array 10 includes a plurality of blocks 11, 12, ..., 1n. The number of blocks 11 - 1n is greater than the number of blocks accessible with the external address. The blocks 11 -1 n comprises a large number of electrically erasable and programmable semiconductor memory cells of, for example, a NAND type or a NOR type.

The address change unit 1 changes the correspondence between an external address and the blocks 11 - 1n. The block correspondence table 31 stores information concerning the correspondence between the external address and the blocks 11 - 1n. The write history information holding unit 2 holds write history information concerning programming for each of the blocks 11- 1n. In the data writing operation (data writing mode), the address control unit 3 refers to the write history information holding unit 2 and the block correspondence table 31, and decodes the external address so that one or more blocks for which programming (data writing) has been carried out a small number of times are selected. Data supplied from an external device is temporarily stored in the buffer unit 5, and written into the specified one or more blocks. After the writing of data, the contents of the block correspondence table 31 are updated. In this manner, the blocks 31 can be equally accessed. In the data reading mode, one or more blocks specified by referring to the block correspondence table 31 are accessed.

Referring to FIG. 1B, the address change unit 1 comprises a correspondence eliminating instruction unit 32, a write instruction unit 33 and a control unit 34 in addition to the block correspondence table 31. The write instruction unit 33 holds information indicating the block identification number of a block for which programming is to be next carried out. The correspondence eliminating unit 32 stores information indicating a block which is to be next eliminated from the correspondence to the external address. In the data writing mode, the control unit 34 controls the memory cell array 10 so that data is written into one or more blocks specified by the write instruction unit 33. Further, the control unit 34 controls the memory cell array 10 so that the contents of the block indicated by the correspondence eliminating instruction unit 32 are transferred into one or more blocks in which pieces of data corresponding to the external address were stored. Furthermore, the control unit 34 updates the contents of the write instruction unit 33 and the correspondence eliminating unit 32 after completing the writing of data. Then, the control unit 34 updates the block correspondence table 31 after completing the writing of data. In the normal access mode (read mode), the control unit 34 accesses the block by referring to the block correspondence table 31. The contents of the write instruction unit 33 and the correspondence elimination instruction unit 32 are selected so that they do not concurrently have the same values.

FIG. 2 illustrates the first embodiment of the present invention in detail. The memory cell array 10 includes five blocks consisting of the first block 11 through the fifth block 15. A row address buffer circuit 50 temporarily stores bits of a row address RADR. A block selecting circuit 20 selects one of the five blocks 11-15 in accordance with predetermined row address bits A0 and A1 and inverted versions /A0 and /A1 thereof (not shown in FIG. 2). It will be noted that symbol "/" denotes a negative logic signal. The block selecting circuit 20 comprises a first-block selecting circuit 21 through a fifth-block selecting circuit 25, which are controlled by a control circuit 30 in a manner which will be described later. The control signal 30 receives predetermined row address bits and a control signal. The control circuit 30 controls the correspondence between the row address signal RADR and the blocks 11-15. Further, the control circuit 30 specifies the block into which data is to be next written, and the block which is to be a blank area. Furthermore, the control circuit 30 controls the sequence of writing (programming).

The external device recognizes that the memory cell array 10 consists of four blocks. The remaining one block is used, as a blank block, to facilitate uniform distribution of the programming of the blocks.

Figure 3:
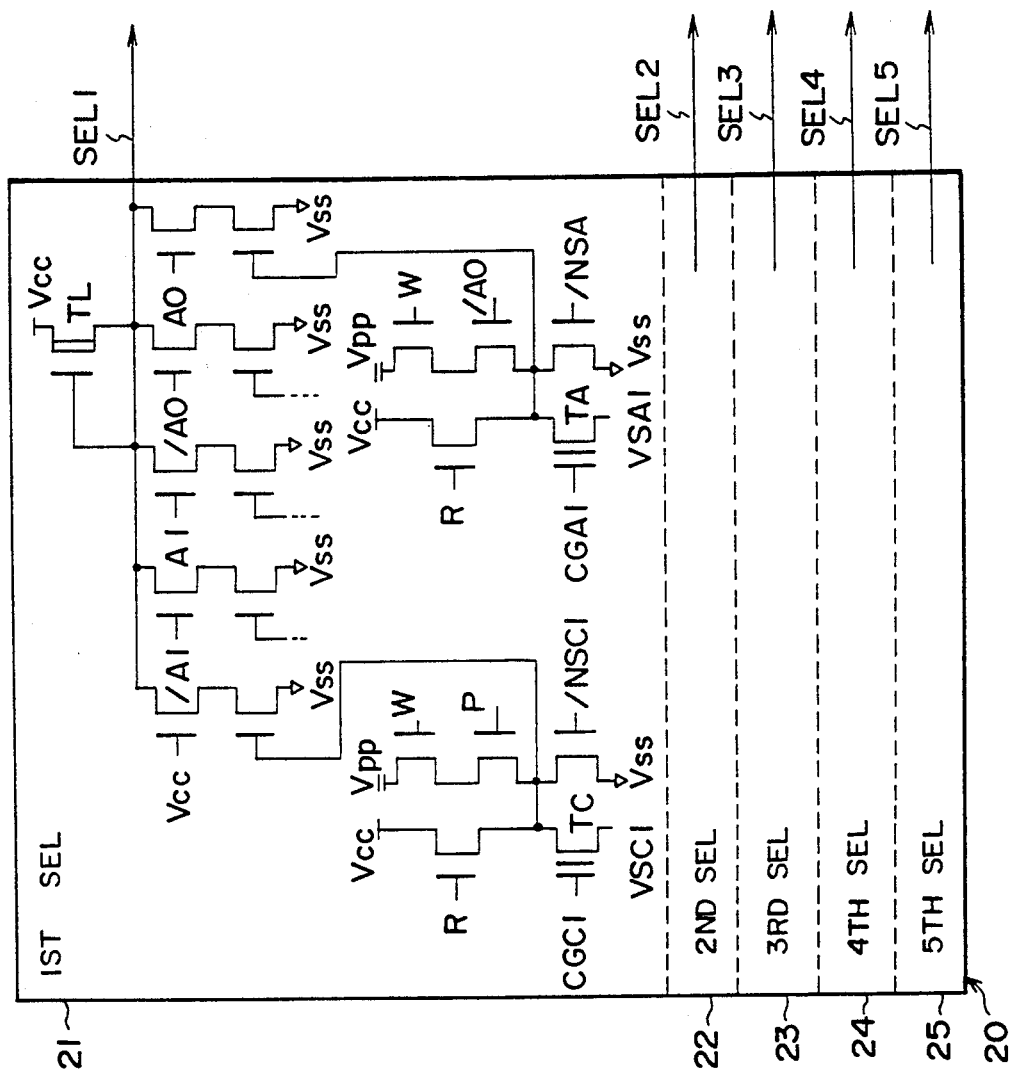
FIG. 3 is a circuit diagram of a block selecting circuit shown in FIG. 2.

FIG. 3 is a circuit diagram of the block selecting circuit 20, which is made up of the first block selecting circuit 21 through the fifth block selecting circuit 25. FIG. 3 shows the details of only the first block selecting circuit 21, and the other blocks 22-25 are configured in the same manner as the first block selecting circuit 21. The first block selecting circuit 21 includes a depletion type transistor TL connected to a Vcc power supply line. Transistors TC and TA are the same transistors as memory cell transistors arranged in the memory cell array 10, data can be written into and erased from the transistors TC and TA. In the structure being considered, the transistors TC and TA have floating gates. Although only one transistor TA is illustrated in FIG. 3, the first block selecting circuit 21 has four transistors TA in practice.

In the configuration being considered, four of the first blocks 11-15 of the memory cell array 10 can be externally recognized, and therefore two row address bits A0 and A1 are applied to the first block selecting circuit 21. The number of row address bits to be applied to the first block selecting circuit 21 depends on the number of blocks of the memory cell array 10. The other structural elements of the first block selecting circuit 21 will be described later.

Figure 4:
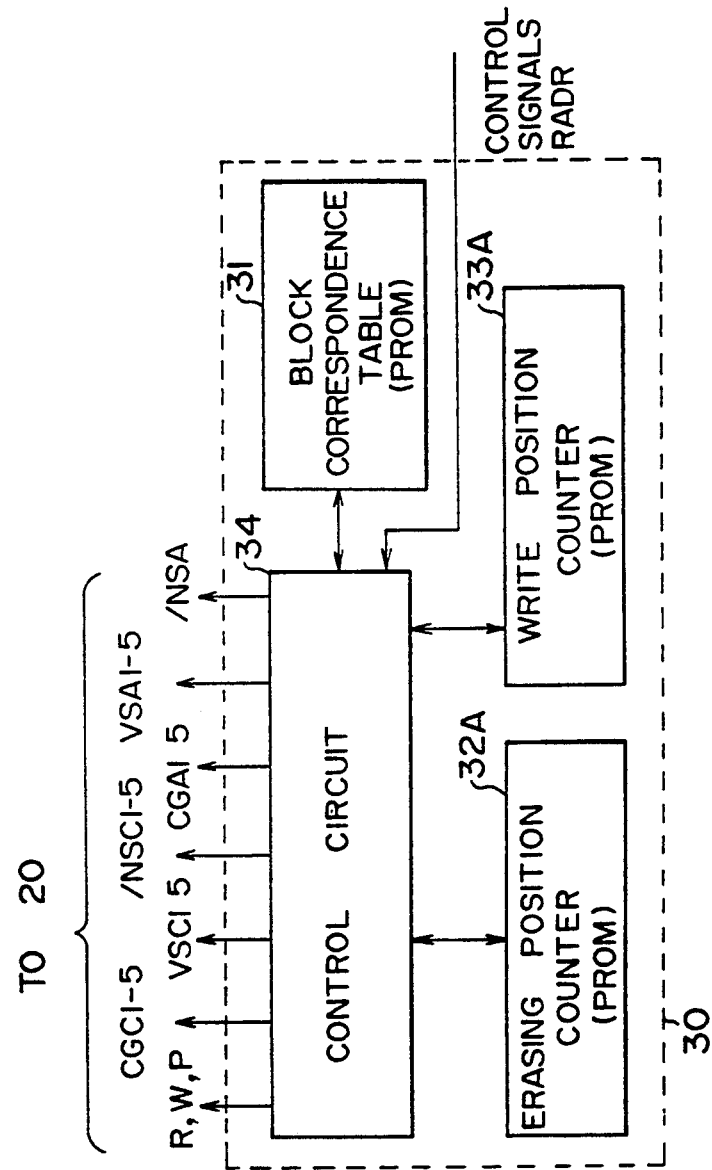
FIG. 4 is a block diagram of a control circuit shown in FIG. 3.

FIG. 4 is a block diagram of the control circuit 30, which corresponds to the address change unit 1 shown in FIG. 1B. The control circuit 30 comprises the block correspondence table formed with a PROM, an erasing position counter 32A formed with a PROM, a write position counter 33A formed with a PROM, and the control circuit 34. The counters 32A and 33A correspond to the correspondence eliminating unit 32 and the write instruction unit 33 shown in FIG. 1B, respectively.

The block correspondence table 31 stores information indicating the correspondence between the blocks 11-15 and the address bits A0 and A1. The erasing position counter 32A indicates the identification number of the block which is to serve as a blank area. The write position counter 33A indicates the identification number of the block into which data is to be next written. The control circuit 34 receives control signals from an external device for controlling the flash memory, the row address signal RADR from the address buffer 50, the correspondence information stored in the block correspondence table 31, and the counter values of the counters 32A and 33A, and controls the block selecting circuits 21-25 on the basis of these signals.

The control circuit 34 generates a read signal R, a write signal W, a TC write control signal P, control signals CGC1-CGC5, TC source power supply voltages VSC1-VSC5, TC forced select signals /NSC1-/NSC5, TA control signals CGA1-CGA5, TA source power supply voltage signals VSA1-VSA5, and a TA forced select signal /NSA. As has been described previously, symbol "/" denotes the negative-logic signal.

The TC write control signal P is applied to the circuits 21-25, and controls writing of data into the transistors TC, which control selecting of blocks. The TC control signals CGC1-CGC5 control switching ON/-OFF of the transistors TC of the circuits 21-25. The TC source power supply voltages VSC1-VSC5 are selecting circuits 21-25. The TC forced select signals /NSC1-/NSC5 select the corresponding blocks 11-15 irrespective of whether the transistors TC of the circuits 21-25 are ON or OFF. The TA source voltages VSA1-VSA5 are source voltages applied to the sources of the transistors TA of the circuits 21-25. The TA forced select signal /NSA allows the blocks to be selected irrespective of whether the transistors TA of the circuits 21-25 are ON or OFF.

FIG. 5 illustrates a table of the logic values of the input signals applied to the control circuit 34. In FIG. 5, the symbol "*" denotes signals that are selectively used in accordance with selection of the block identified by the block identification number stored in the erasing position counter 32A and selection of the block in which data corresponding to the external address RADR are stored up to this time.

FIG. 6 illustrates a table of the logic values of the output signals generated by the control circuit 34. The symbol "*" has the same meaning as described above. The character "S" denotes a signal applied to the selected block, and the character "NS" denotes a signal applied to the non-selected blocks. Voltages Vss, Vcc and Vpp are illustrated shown in FIG. 3.

In FIGS. 5 and 6, the following modes are defined. In mode #1, the block specified by the write position counter 33A is selected, and pieces of data in the specified block are erased. In mode #2, pieces of data stored in the transistors TC and TA in the block selecting circuit related to the block specified by the write position counter 33A are erased. In mode #3, the block specified by the write position counter 33A is selected, so that pieces of data are written into the memory cells therein. In mode #4, data is written into the transistor TA in the block selecting circuit related to the block specified by the write position counter 33A. In mode #5, the block specified by the block correspondence table 31 is selected, so that pieces of data in the specified block are erased. In mode #6, pieces of data stored in the transistors TC and TA in the block selecting circuit related to the block specified by the block correspondence table 31 are erased. In mode #7, the block specified by the erasing position counter 32A is selected, and the block specified by the block correspondence table 31 is selected, so that data is transferred between the selected blocks. In mode #8-1, data is written into the transistor TA in the block selecting circuit related to the block specified by the block correspondence table 31. In mode #8-2, data is written into the transistor TC in the block selecting circuit related to the block indicated by the erasing position counter 32A. In mode #9, the contents of the block correspondence table 31 are updated (the output signals do not change in this mode). In mode #10, the contents of the write position counter 33A and the erasing position counter 32A are updated (the output signals do not change in this mode).

The control circuit 34 is made up of circuits shown in FIGS. 7A through 7E. The circuit shown in FIG. 7A includes transistors TR1-TR11. A circuit including the transistors TR1 and TR2 receives the signal *R and outputs the signal R to the block selecting circuit 20. A circuit including the transistors TR3 and TR4 receives the signal *W, and outputs the signal W to the block selecting circuit 20. A circuit including the transistors TR5 and TR6 receives the signal *P and outputs the signal P to the block selecting circuit 20. A circuit including the transistors TR7 and TR8 receives the signal *NSA and outputs the signal /NSA to the block selecting circuit 20. A circuit including the transistors TR9, TR10 and TR11 receives the signal *CGC and the output signal EP(N) of the erasing position counter 32A, and outputs the signal CGC-N (N=1-5 for the configuration shown in FIG. 3) to the block selecting circuit 20. When /EP(N)=0, data is erasable from the corresponding block. When /EP(N)=1, data cannot be erased from the corresponding block.

Figure 7A:
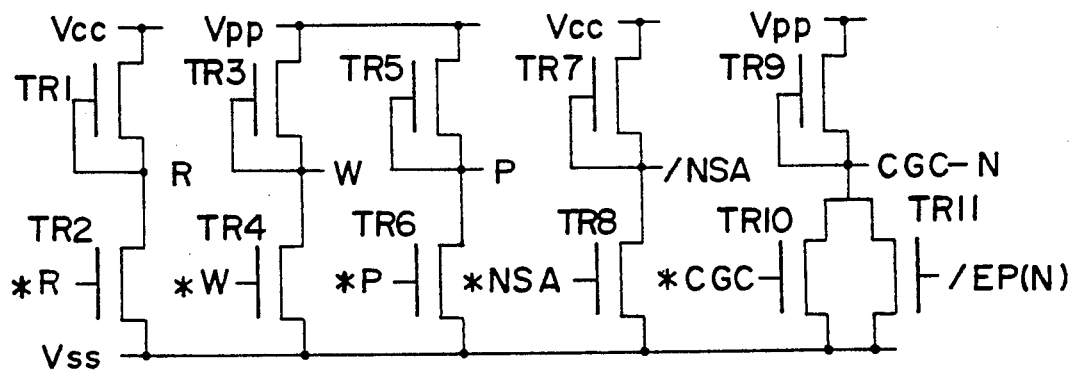
FIGS. 7A through 7E are circuit diagrams of the control circuit shown in FIG. 4.
Figure 7B:
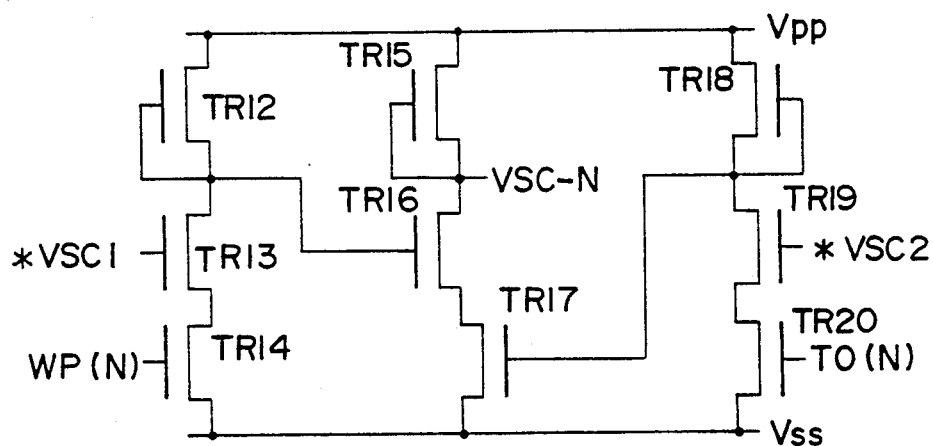

The circuit shown in FIG. 7B comprises transistors TR12-TR20. A circuit including transistors TR12, TR13 and TR14 receives the signal *VSC1 and the output signal WP(N) of the write position counter 33A, and applies a corresponding output signal to the gate of the transistor TR16. When WP(N)=1, data can be written into the corresponding block. When WP(N)=0, data cannot be written into the corresponding block. A circuit including transistors TR19, TR20 and TR21 receives the signal *VSC2 and the table output TO(N) of the block correspondence table 31, and applies a corresponding output signal to the gate of the transistor TR17. When TO(N)=1, the corresponding block is specified by the external row address RADR. When TO(N)=0, the corresponding block is not the block specified by the external row address RADR. A circuit including the transistors TR15, TR16 and TR17 receives the above-described two output signals, and outputs the signal *VSC-N to the block selecting circuit 20.

Figure 7C:
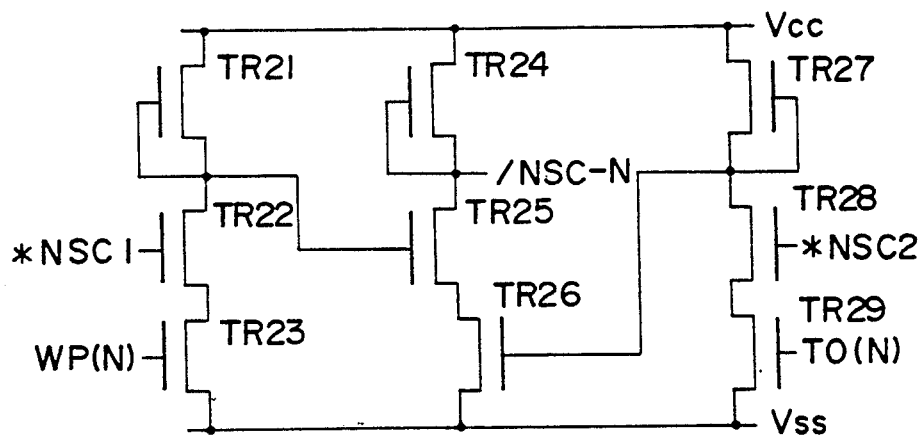

The circuit shown in FIG. 7C comprises transistors TR21-TR 29. A circuit including the transistors TR21, TR22 and TR23 receives the signal *NSC1 and the counter output WP(N) of the write position counter 33A, and applies a corresponding output signal to the gate of the transistor TR25. A circuit including the transistors TR27, TR28 and TR29 receives the signal *NSC2 and the table output TO(N), and applies a corresponding output signal to the gate of the transistor TR26. A circuit including the transistors TR24, TR25 and TR26 receives the abovedescribed two output signals, and outputs the signal /NSC-N to the block selecting circuit 20.

Figure 7D:
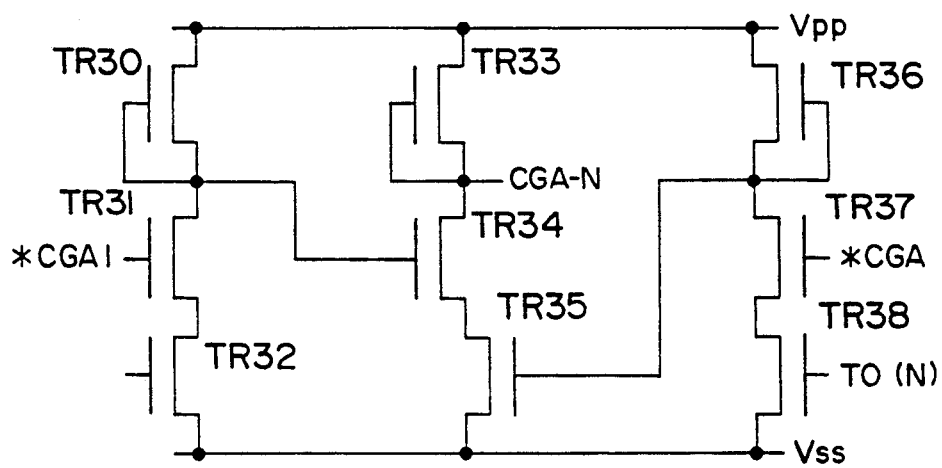

The circuit shown in FIG. 7D comprises transistors TR30-TR38. A circuit including the transistors TR30, TR31 and TR32 receives the signal *CGA1 and the counter output WP(N), and applies a corresponding output signal to the gate of the transistor TR34. A circuit including the transistors TR36, TR37 and TR38 receives the signal *CGA2 and the table output TO(N), and applies a corresponding output signal to the gate of the transistor TR35. A circuit including the transistors TR33, TR34 and TR35 receives the above-described two output signals, and outputs the signal CGA-N to the block selecting circuit 20.

Figure 7E:
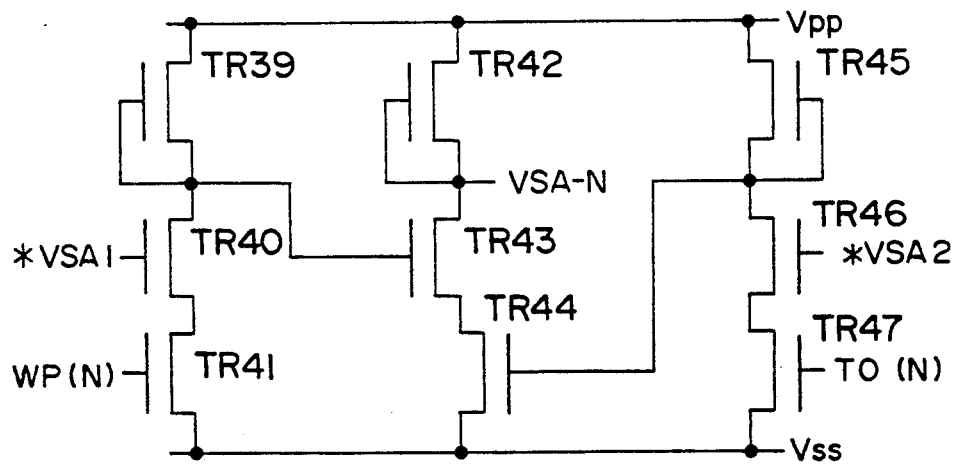

The circuit shown in FIG. 7E comprises transistors TR39-TR47. A circuit including the transistors TR39, TR40 and TR41 receives the signal *VSA1 and the counter output WP(N), and applies a corresponding output signal to the gate of the transistor TR43. A circuit including the transistors TR45, TR46 and TR47 receives the signal *VSA2 and the table output TO(N), and applies a corresponding output signal to the gate of the transistor TR44. A circuit including the transistors TR42, TR43 and TR44 receives the above-described two output signals, and outputs the signal VSA-N to the block selecting circuit 20.

Returning to FIG. 2, there is provided a row decoder 40 including five row decoder circuits 41-45 respectively connected to the first to fifth block selecting circuits 21-25.

Figure 8:
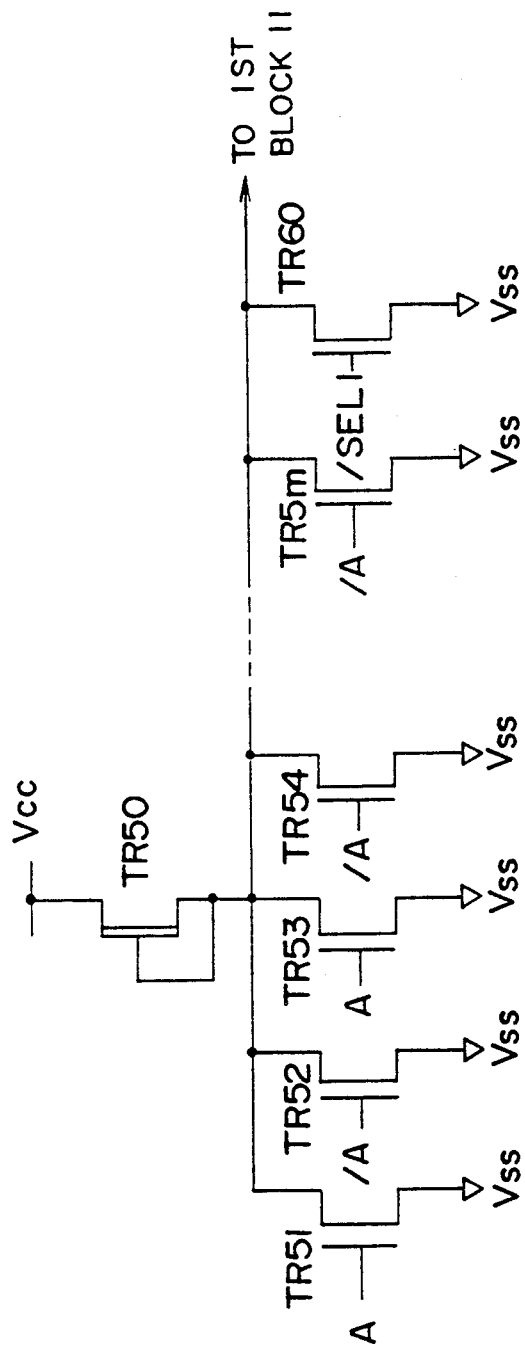
FIG. 8 is a circuit diagram of a decoder shown in FIG. 2.

FIG. 8 is a circuit diagram of the row decoder circuit 41, which comprises a depletion type transistor TR50, a predetermined number of transistors TR51-TR5m, and a transistor TR60. The transistors TR51-TR5m respectively receive predetermined address bits of the row address signal RADR. The inverted version of a block selecting signal SEL1 from the first block selecting circuit 21 is applied to the gate of the transistor TR60. When the inverted version of the block selecting signal SEL1 is low, the transistor TR60 is turned OFF and the first block 11 is selected. In this state, when the predetermined address bits of the row address signal RADR are applied to the gates of the corresponding transistors TR51-TR5m, these transistors are turned OFF, and a high-level decoded signal is applied to the first block 11.

A description will now be given, with reference to FIGS. 9A and 9B, of the operation of the first embodiment of the present invention. It will now be assumed that data 00, data 01, data 10 and data 11 correspond to the combinations of the address bits A1 and A0, (0, 0), (0, 1), (1, 0) and (1, 1), respectively. Each of data 00, 01, 10 and 11 consists of bits based on the number of memory cells in each of the blocks 11-15.

It will now be assumed that the initial state ((0) in FIG. 9A) of the device before programming is such that data 00, data 01, data 10 and data 11 are respectively stored in the second block 12, the third block 13, the fourth block 14 and the fifth block 15. The block correspondence table 31 stores information indicating the above initial state. The value of the write position counter 33A is 1, which means that the first block 11 is a blank block into which data is to be next written. The value of the erasing position counter 32A is 2, which means that the next blank block is the second block 12. In the above initial state of the device, programming is carried out as follows.

The following step numbers in parentheses correspond to those shown in FIGS. 9A and 9B.

Step (1)

The step (1) erases data stored in the block (the first block 11) specified by the write position counter 33A. The step (1) corresponds to mode #1. In the step (1), the output signals of the control circuit 34 are as follows (see FIGS. 5 and 6): R=Vcc. W= Vss, P=Vss, CGC1-CGC5=Vss, VSC1-VSC5=Vss, /NSC1=Vcc, /NSC2-/NSC5=Vss, CGA1-CGA5=Vss, VSA1-VSA5=Vss, and /NSA=Vcc. Hence, the block selecting signal SEL1 from the first block selecting circuit 21 is set to voltage Vcc, and block selecting signals SEL2-SEL5 respectively output from the second through fifth block selecting circuits 22-25 are set to voltage Vss. That is, only the first block 11 is selected. In this state, the data stored in the first block 11 is erased in a manner employed in conventional flash EEPROM.

Step (2)

The step (2) erases data stored in the transistors TC and TA in the block selecting circuit (21) related to the block specified by the write position counter 33A. The step (2) corresponds to mode #2. In the step (2), the output signals of the control circuit 34 are as follows: R=Vss, W=Vss, P=Vss, CGC1-CGC5=Vss, VSC1=Vpp, VSC2-VSC5=Vss, /NSC1 -/NSC5=VSS, CGAI-CGA5=Vss, VSA1=Vpp, VSA2-VSA5 =Vss, and /NSA=Vss. Hence, electrons stored in the floating gates of the transistors TC and TA in the first block selecting circuit 21 are output to VSC1 and VSA1.

Step (3)

The step (3) writes data (data 10) into the position counter 33A. The step (3) corresponds to mode #3. In the step (3), the output signals of the control circuit 34 are as follows: R=Vcc, W=Vss, P=Vss, CGC1—CGC5=Vss, VSC1—VSC5=Vss, /NSC1=Vcc, /NSC2—/NSC5=Vss, CGA1—CGA5=Vss, VSA1—VSA5=Vss, and /NSA=Vcc. In this state, the block selecting signal SEL1 from the first block selecting circuit 21 is set to Vcc, and the block selecting signals SEL2-SEL5 from the second through fifth block selecting circuit 22-25 are set to Vss. Hence, the first block 11 is selected. In this state, data 10 is written into the first block 11 in the conventional manner.

Step (4)

The step (4) writes data corresponding to data 10 into the transistor TA in the block selecting circuit (the first block selecting circuit 21) associated with the block specified by the write position counter 33A. The step (4) corresponds to mode #4. In the step (4), the output signals of the control circuit 34 are as follows: R=Vss, W=Vpp, P=Vss, CGC1—CGC5=Vss, VSC1—VSC5=Vss, /NSC1—/NSC5=VSS, CGA1=Vpp, CGA2—CGA5=Vss, VSA1—VSA5=Vss, and /NSA=Vss. One of the bits A0 and A1 is set to Vss, and the other bit is set to Vpp (in the example being considered, AO=Vss, /A0=Vpp. A1=Vpp and /A1 =Vss). Hence, the high voltage Vpp (>Vcc) is applied to the gate of the transistor TA in the block selecting circuit 21, and thereby electrons are stored in the floating gate thereof.

Step (5)

The step (5) refers to the block correspondence table 31, and executes the erasing operation on the block (the fourth block 14) in which data (data 10) corresponding to the external address has been stored up to this time. The step (5) corresponds to mode #5. In the step (5), the output signals of the control circuit 34 are as follows: R=Vcc, W=Vss, P=Vss, CGC1—CGC5=Vss, VSC1—VSC5=Vss, /NSC4=Vcc, /NSC1−/NSC3=Vss, /NSC5=Vss, CGA1−−CGA5=Vss, VSA1−VSA5=Vss, and /NSA=Vcc. Thereby, the block selecting signal SEL4 from the fourth block selecting circuit 24 is set to Vcc, and the block selecting signals SEL1-SEL3 and SEL5 respectively output from the first through third and fifth block selecting circuits 21-23 and 25 are set to Vss. In this manner, the fourth block 14 is selected. In this state, data stored in the fourth block 14 is erased.

Step (6)

The step (6) erases data stored in the transistors TC and TA in the block selecting circuit (the fourth block selecting circuit 24) related to the block (the fourth block 14) in which the data corresponding to the external address was stored. In the step (6), the output signals of the control circuit 34 are as follows: R=Vss, W=Vss, P=Vss, CGC1 CGC5 =Vss, VSC4=Vpp, VSC1−VSC3=Vss, VSC5=Vss, /NSC1−/NSC5=Vss, CGA1−CGA5=Vss, VSA4=Vpp, VSA1−VSA3=Vss, VSA5=Vss, and /NSA=Vss. Thereby, the electrons stored in the floating gates of the transistors TC and TA in the fourth block selecting circuit 24 are output to VSC4 and VSA4.

Step (7)

The step (7) transfers the contents of the block (the second block 12) specified by the erasing position counter 32A to the block in which the data corresponding to the external address was stored (the block subjected to the erasing operation in step (5), that is, the fourth block 14). The step (7) corresponds to mode #7. Data is read from the second block 12, and transferred to the corresponding cells of the fourth block 14. The second block 12 and the fourth block 14 are selected in the same manner as the steps (12) and (5). The reading and writing operations are carried out in the conventional manner.

Step (8)

The step (8) writes data corresponding to the data (data 00, that is, data corresponding to A1=0, A0=0) stored in the block (the second block 12) specified by the erasing position counter 32A, into the transistor TA in the block selecting circuit (the fourth block selecting circuit 24) related to the block (the fourth block 14) in which the data corresponding to the external address was stored. The step (8) corresponds to mode #8-1. The output signals of the control circuit 34 are the same as those used in the step (5).

Step (9)

The step (9) writes data into the transistor TC in the block selecting circuit (the second block selecting circuit 24) related to the block (the second block 12) specified by the erasing position counter 32A. The step (9) corresponds to mode #8-2. The output signals of the control circuit 34 are as follows: R=Vss, W=Vpp, P=Vpp, CGC1=Vpp, CGC2−CGC5=Vss, VSC1−VSC5=Vss, /NSC1−/NSC5=Vss, CGA1−−CGA5=Vss, VSA1−VSA5=Vss, and /NSA=Vss.

Step (10)

The step (10) updates the contents of the block correspondence table 31 in response to the programming. The step (10) corresponds to mode #9.

Step (11)

In the step (11), the contents of the erasing position counter 32A and the write position counters 33A are changed.

In the above-described manner, the identification number of the block into which data is next to be written is held in the write position counter 33A, and the identification number of the block which is next to be a blank area is held in the erasing position counter 32A. The identification number held in the counter 33A is changed as 1 - 2 - 3 - 4 - 5 - 1, and the identification number held in the counter 32 is changed as 2 - 3 - 4 - 5 - 1 - 2. Hence, even when the blocks 11-15 are not equally accessed for programming by the external device, the blocks 11-15 are equally accessed, and the overall lifetime of the flash memory can be improved. It is also possible to use another selecting sequence making it possible to equally access the blocks for programming.

Alternatively, it is possible to externally apply external control signals to the flash memory in order to realize the above-mentioned sequence or to externally apply some control signals to the flash memory. When a RAM area for storing the external address and data necessary to sequentially select the blocks is provided in the flash memory device, the above-mentioned operation can be performed independently of the external device or system.

A description will now be given of a second embodiment of the present invention. In the first embodiment of the present invention, programming can be carried out for one block at a time. In the second embodiment of the present invention, programming can be carried out for two or more blocks at a time. It will be noted that the time necessary to concurrently rewrite a plurality of blocks does not much depend on the number of bits to be erased. Hence, it is very advantageous to concurrently erase the contents of a plurality of blocks and concurrently write data therein.

Figure 10:
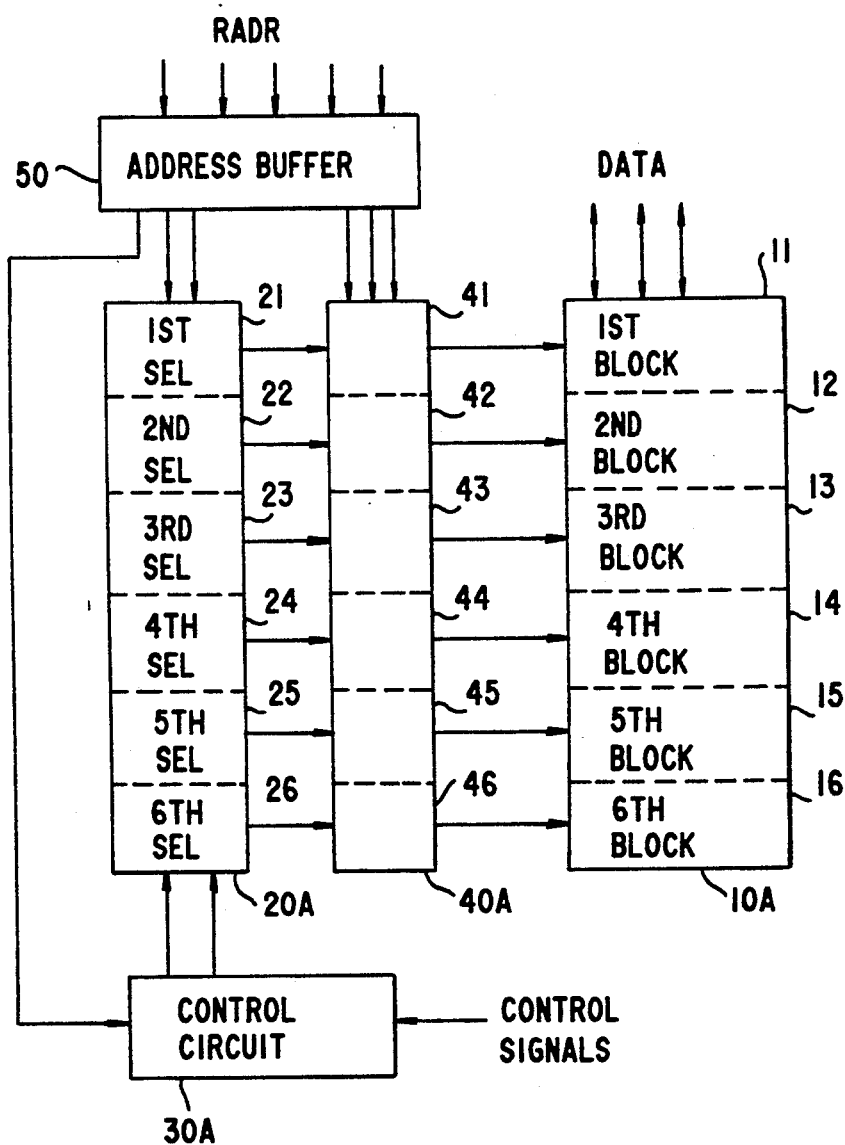
FIG. 10 is a block diagram of a second embodiment of the present invention.

FIG. 10 is a block diagram of the second embodiment of the present invention. In FIG. 10, parts that are the same as parts shown in the previously described figures are given the same reference numbers. A memory cell array 10A comprises six blocks 11-16. A block selecting circuit 20A comprises six block selecting circuits 21-26, and selects a plurality of blocks in accordance with the row address signal RADR. A control circuit 30A controls the correspondence between the row address signal RADR and the blocks 11-16. Further, the control circuit 30A specifies two blocks into which pieces of data are to be next written, and two blocks which are to be blank areas. Furthermore, the control circuit 30 controls the sequence of writing (programming). A row decoder 40A comprises six row decoder circuits 41-46.

The memory cell array 10A is externally accessed in such a manner that it has four blocks. Two of the six blocks in the memory cell array 10A are used as blank areas in order to equally access the blocks for programming.

The configurations of the block selecting circuit 20A and the control circuit 30A are obtained by simply expanding the configurations of the circuits 20 and 30, and therefore illustration thereof will be omitted here. Similarly, the configuration of the control circuit 40A is obtained by simply expanding the configuration of the control circuit 30, and therefore illustration thereof will be omitted here. This means that FIGS. 5, 6 and 7A through 7E hold true for the control circuit 40A. However, there are the following exceptions: when the number of blocks to be programmed is less than the maximum number of blocks (2 in the example being considered) which can be concurrently programmed, data is written into the block having priority higher than the other blocks. The counter output WP(N) of the write position counter 32A is 1 with respect to the two corresponding blocks in modes #1 and #2. The counter output WP(N) sequentially selects the two corresponding blocks in modes #3 and #4. The table output TO(N) is 1 with respect to the two corresponding blocks in modes #5 and #6. The counter output EP(N) and the table output TO(N) sequentially select the two corresponding blocks in mode #7. The table output TO(N) sequentially selects the two corresponding blocks in mode #8-1. The counter output EP(N) is 1 with respect to the two corresponding blocks in mode #8-2.

A description will now be given, with reference to FIGS. 11A and 11B, of the operation of the second embodiment of the present invention. In FIGS. 11A and 11B, [] corresponds to the following step (). In the initial state, data 00, data 01, data 10 and data 11 are respectively stored in the first block 11 through the fourth block 14. The fifth block 15 and the sixth block 16 are blank areas. Out of two counter values in either of the counters 32A and 33A, the smaller value has higher priority. For example, the counter value 1 of the counter 32A has priority over the counter value 2 thereof. In the initial state, the erasing position counter 32A indicates the first block 11 and the second block 12 (the first block has priority over the second block 12), and the write position counter 33A indicates the fifth block 15 and the sixth block 16 (the fifth block has priority over the sixth block 16).

Data 01 and data 10 are written into the memory cell array 10A as follows.

Step (1)

In the step (1), pieces of data stored in the fifth block 15 and the sixth block 16 indicated by the write position counter 33A are erased, and data 01 and data 10 are respectively written into the first block 15 and the sixth block 16.

Step (2)

In the step (2), data 01 and data 10 respectively stored in the second block 12 and the third block 13 are erased.

Step (3)

In the step (3), the contents of the first block 11 (data 00) which becomes a blank area are transferred to the second block 12, and the contents of the second block 12 are transferred to the third block 13.

Step (4)

In the step (4), the contents of the block selecting circuit 20A and the control circuit 30A are updated, so that the correct correspondence between the external address and the blocks of the memory cell array 10 exists.

In the above-described manner, data 00, data 11, data 01 and data 10 are respectively stored in the third block 13, the fourth block 14, the fifth block 15 and the sixth block 16. The erasing position counter 32A indicates the third block 13 and the fourth block 14, and the write position counter 33A indicates the first block 11 and the second block 12.

Alternatively, it is possible to externally apply external control signals to the flash memory in order to realize the above-mentioned sequence or to externally apply some control signals to the flash memory. When a RAM area for storing the external address and data necessary to sequentially select the blocks is provided in the flash memory device, the above-mentioned operation can be performed independently of the external device or system.

Figure 12:
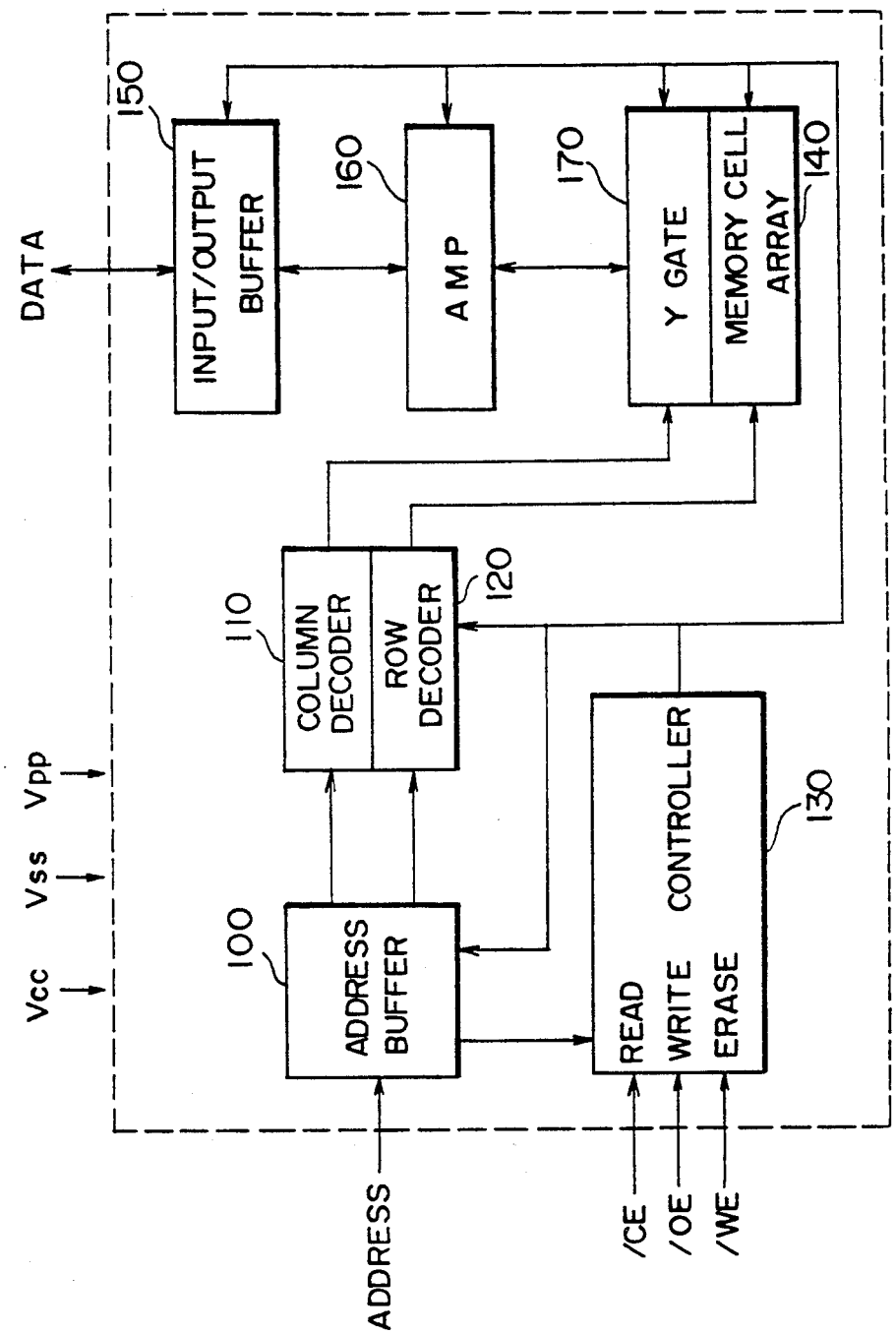
FIG. 12 is a block diagram of the entire structure of a memory device.

FIG. 12 is a block diagram of an EEPROM device to which the present invention is applied. The EEPROM device comprises an address buffer 100, a column decoder 110, a row decoder 120, a controller 130, a memory cell array 140, an input/output buffer 150, a sense amplifier/write amplifier 160, and a Y-gate circuit 170. The aforementioned address change unit 1 shown in FIGS. 1A and 1B is implemented by the controller 130 and the row decoder 120. The buffer unit 5 shown in FIGS. 1A and 1B corresponds to the input/output buffer 150.

An external address signal is applied to the address buffer 100, which outputs column and row address signals to the column decoder 110 and the row decoder 120, respectively. The decoded row address signal and the decoded column address signal are applied to the memory cell array 140 and the Y-gate circuit 170, respectively. The controller 130 externally receives a chip select signal /CE, an output enable signal /OE and a write enable signal /WE. The controller 130 executes conventional control processes in addition to the aforementioned process of the present invention. Data is transferred between the memory cell array 140 and an external device via the input/output buffer 140, the sense amplifier/write amplifier 160 and the Y-gate circuit 170.

The present invention is not limited to the specifically disclosed embodiments, and variations and modifications may be made without departing from the scope of the present invention. The present invention is not limited to flash memories but includes EEPROMs.

What is claimed is:

1. An electrically erasable and programmable memory device comprising:

a memory cell array comprising a plurality of blocks, each comprising electrically erasable and programmable memory cells;

data input/output means, coupled to said memory cell array, for transferring data between the memory cell array and an external device; and address conversion means, coupled to said memory cell array, for converting an external address signal into a decoded signal applied to the memory cell array so that a correspondence between the external address and the plurality of blocks is changed so as to equally access the plurality of blocks for programming, the number of the plurality of blocks being greater than the number of blocks accessible by the external address signal.

2. The electrically erasable and programmable memory device as claimed in claim 1, wherein said address conversion means comprises control means for changing the correspondence between the external address and the plurality of blocks when the memory cell array is programmed.

3. The electrically erasable and programmable memory device as claimed in claim 1, wherein said address conversion means comprises:

first means for storing a current correspondence between the external address and the plurality of blocks;

second means, coupled to said first means, for updating the current correspondence between the external address and the plurality of blocks in accordance with a sequence in which blocks are sequentially accessed for programming.

4. The electrically erasable and programmable memory device as claimed in claim 1, wherein said address conversion means comprises:

first means for storing a current correspondence between the external address and the plurality of blocks; and second means, coupled to said memory cell array and said first means, for selecting at least one of the plurality of blocks by referring to the current correspondence between the external address and the plurality of blocks.

5. The electrically erasable and programmable memory device as claimed in claim 4, wherein said address conversion means comprises third means, coupled to said first means, for updating the current correspondence so that the plurality of blocks are equally accessed for programming.

6. The electrically erasable and programmable memory device as claimed in claim 1, wherein said address conversion means comprises:

first means, coupled to the memory cell array, for selecting at least one of the plurality of blocks into which data received via said data input/output means should be written;

second means, coupled to the memory cell array, for selecting one blank block from among the plurality of blocks; and third means, coupled to said memory cell array and said second means, for transferring data stored in said one blank block to one of the blocks in which data corresponding to the data received via said data input/output means is stored.

7. The electrically erasable and programmable memory device as claimed in claim 6, wherein:

said address conversion means comprises fourth means, coupled to said third means, for storing a current correspondence between the external address and the plurality of blocks; and said third means comprises means for referring to said fourth means in order to identify said one of the blocks in which data corresponding to the data received via said data input/output means is stored.

8. The electrically erasable and programmable memory device as claimed in claim 1, wherein said address conversion means comprises:

first means, coupled to the memory cell array, for selecting blocks from among the plurality of blocks into which data received via said data input/output means should be written;

second means, coupled to the memory cell array, for selecting blank blocks from among the plurality of blocks; and third means, coupled to said memory cell array and said second means, for transferring data stored in said blank blocks to blocks among the plurality of blocks in which data corresponding to the data received via said data input/output means is stored.

9. The electrically erasable and programmable memory device as claimed in claim 8, wherein:

said address conversion means comprises fourth means, coupled to said third means, for storing a current correspondence between the external address and the plurality of blocks; and said third means comprises means for referring to said fourth means in order to identify said blocks in which data corresponding to the data received via said data input/output means is stored.

10. The electrically erasable and programmable memory device as claimed in claim 1, wherein said electrically erasable and programmable memory cells comprises transistors having floating gates.

11. The electrically erasable and programmable memory device as claimed in claim 1, wherein said address conversion means comprises electrically erasable and programmable transistors.

12. The electrically erasable and programmable memory device as claimed in claim 3, wherein said first means comprises electrically erasable and programmable transistors.

13. The electrically erasable and programmable memory device as claimed in claim 1, wherein said electrically erasable and programmable memory device is a flash memory.

* * * * *